(12) United States Patent
Yan et al.

(10) Patent No.: US 9,136,266 B2
(45) Date of Patent: Sep. 15, 2015

(54) GATE OXIDE QUALITY FOR COMPLEX MOSFET DEVICES

(71) Applicant: GLOBALFOUNDRIES Inc., Grand Cayman (KY)

(72) Inventors: Ran Yan, Dresden (DE); Nicolas Sassiat, Dresden (DE); Jan Hoentschel, Dresden (DE); Torben Balzer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 26 days.

(21) Appl. No.: 13/943,229

(22) Filed: Jul. 16, 2013

(65) Prior Publication Data
US 2015/0021703 A1   Jan. 22, 2015

(51) Int. Cl.
| H01L 21/00 | (2006.01) |
| H01L 27/092 | (2006.01) |
| H01L 29/16 | (2006.01) |
| H01L 29/66 | (2006.01) |
| H01L 29/78 | (2006.01) |

(52) U.S. Cl.
CPC .............. *H01L 27/092* (2013.01); *H01L 29/16* (2013.01); *H01L 29/66477* (2013.01); *H01L 29/78* (2013.01)

(58) Field of Classification Search
CPC .................................................... H01L 21/8238
USPC .................................... 438/199, 285, E21.409
See application file for complete search history.

(56) References Cited

U.S. PATENT DOCUMENTS

2010/0167482 A1*   7/2010   Mori et al. ..................... 438/285

\* cited by examiner

*Primary Examiner* — Tran Tran
(74) *Attorney, Agent, or Firm* — Amerson Law Firm, PLLC

(57) ABSTRACT

In various aspects, methods of forming a semiconductor device and semiconductor devices are provided. In some illustrative embodiments herein, a silicon/germanium layer is provided on a semiconductor substrate. On the silicon/germanium layer, at least one insulating material layer is formed. After having performed a thermal annealing process, the at least one insulating material layer is removed in subsequent process sequences such that the silicon/germanium layer is at least partially exposed. In further processing sequences which are to be subsequently applied, a gate electrode is formed on the exposed silicon/germanium layer.

14 Claims, 5 Drawing Sheets

GATE OXIDE QUALITY FOR COMPLEX MOSFET DEVICES

BACKGROUND OF THE INVENTION

1. Field of the Invention

The present invention generally relates to improving the quality of gate oxides in complex MOSFET devices, and, more particularly, to the formation of conductive channel regions below gate electrodes of complex MOSFET devices.

2. Description of the Related Art

The majority of present-day integrated circuits (ICs) are implemented by using a plurality of interconnected field effect transistors (FETs), also called metal oxide semiconductor field effect transistors (MOSFETs) or simply MOS transistors. Typically, present-day integrated circuits are implemented by millions of MOS transistors which are formed on a semiconductor substrate with a given surface area.

Basically, MOS transistors act as electronic switching elements, wherein a current through a channel region formed between source and drain regions of a MOS transistor is controlled by a gate electrode which is typically disposed over the channel region, independent of whether a PMOS transistor or an NMOS transistor is considered. Particularly, the conductivity state of a transistor is changed by a voltage applied to the gate electrode passing a so-called threshold voltage (Vt). In general, the threshold voltage depends non-trivially on the transistor's properties, such as size, material, etc.

However, as semiconductor devices and device features have become smaller in order to comply with requirements set by advanced integration densities, conventional fabrication techniques have been pushed to their limits, challenging their abilities to produce finely defined features at presently required scales. Consequently, developers are faced at each scale with problems and constraints imposed by scaling limitations which arise with semiconductor devices continuing to decrease in size.

A severe issue met by developers when attempting to exceed current technology nodes is given by constraints on maximum thicknesses of gate dielectrics in advanced gate electrodes set by the requirement of implementing a sufficiently high capacitive coupling between the gate electrode and the underlying channel region so as to reliably control a conductivity state of the channel region, while suppressing leakage currents of the gate electrode into the channel region through the gate dielectric. With decreasing gate length, this becomes an increasingly critical issue because the capacitive coupling of the gate electrode to the channel region strongly depends on the thickness of the gate dielectric. Particularly, for maintaining a sufficiently high capacitive coupling, a gate dielectric with a sufficiently small thickness has to be provided. On the other hand, the probability of tunneling of charge-carriers through the gate dielectric and, therefore, the presence of a tunneling current between gate electrode and channel region increases with decreasing thickness of the gate dielectric. This situation has been addressed by using so-called high-k dielectrics having k-values greater than 5 which allow, on the one hand, increasing the thickness of the gate dielectric so as to reduce the tunneling currents, while, on the other hand, maintaining a sufficiently high capacitive coupling between the gate electrode and the channel region due to its high electrical permeability.

In present integrated circuits formed on semiconductor substrates, a large number of different semiconductor devices and device structures are formed in order to implement a plurality of required functions on a microchip. For example, current integrated circuits may comprise a huge number (on the order of millions) of EG devices and SG devices which are disposed at different device areas of the semiconductor substrate on which the integrated circuit is to be formed on. Due to current high integration densities of complex semiconductor devices at present reaching the deep submicron regime, it is not hard to see that fabrication methods are highly complex and involve a large number of different processes to form individual semiconductor devices and semiconductor device structures on a given surface of a semiconductor wafer in accordance with a desired layout. In current fabrication processes, processing time may be reduced by performing a multitude of different semiconductor devices in parallel when possible, which also helps to save manufacturing costs.

EG devices have a much thicker gate oxide when compared to SG devices because EG devices are usually used as input-output devices (I/O devices) at peripheral regions of integrated circuits where usually comparably high voltages are applied (possibly up to about 15 V). The risk of gate dielectric breakdown, i.e., a breakthrough of gate oxide, is reduced with increasing gate oxide thickness, due to gate electrodes with thicker gate oxides supporting higher gate voltages. Consequently, device failure is prevented.

In current fabrication processes, EG devices and SG devices are fabricated in parallel, wherein a thick gate oxide layer is formed over EG and SG device regions, followed by an etching process for etching of the thick gate oxide from above the SG device regions. Subsequently, gate oxides are formed over the SG device regions and a gate etch is performed to pattern gate electrodes in EG device regions and SG device regions. The thick gate oxides for EG devices are conventionally created by high temperature oxidation (HTO) processes which show faster oxide growth rates as compared to low temperature oxidation processes, such as oxide deposition by chemical vapor deposition (CVD) at about 600° C., for instance, used in TEOS processes. Conventional high temperature oxidation processes are performed as low pressure chemical vapor deposition (LPCVD) deposition processes at temperatures of about 900° C. using a combination of dichlorosilane $SiH_2CL_2$ and $N_2O$.

When etching off the thick gate oxide layer or high thermal oxide (HTO) layer on top of SG devices, it is hard to avoid also removing semiconductor material formed below the SG devices, said semiconductor material often comprising a small silicon/germanium layer, a so-called channel silicon/germanium (cSiGe), when PMOS devices are considered. As a result, a surface roughness of silicon material surfaces is created in SG device regions. Due to the surface roughness of semiconductor material surfaces in the SG device regions, interfaces between the semiconductor material and layers to be formed on the semiconductor material in the SG device regions are deteriorated in quality. The inventors understood that surfaces of poor quality increase a density of charge traps in subsequently-formed interfaces of poor quality. Consequently, undesired variations due to interface charge trapping effects and poor charge carrier mobility characteristics arise which become intolerable for complex semiconductor device structures at present technology nodes, particularly at technology nodes smaller than 50 nm, or preferably smaller than 30 nm.

It is, therefore, desirable to provide a method which allows improving the fabrication of semiconductor device structures to provide gate oxides having superior quality. Particularly, it is desirable to provide improved charge carrier mobility at interfaces adjacent to channel regions and reducing variations caused by interface charge trapping, and particularly to avoid interface charge trapping due to providing interfaces of superior quality adjacent to channel regions of semiconductor device structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention provides in various aspects for methods of forming a semiconductor device and semiconductor devices. In some illustrative embodiments herein, a silicon/germanium layer is provided on a semiconductor substrate. On the silicon/germanium layer, at least one insulating material layer is formed. After having performed a thermal annealing process, the at least one insulating material layer is removed in subsequent process sequences such that the silicon/germanium layer is at least partially exposed. In further processing sequences which are to be subsequently applied, a gate electrode is formed on the exposed silicon/germanium layer.

In a first aspect of the present disclosure, a method of forming a semiconductor device is provided. In one illustrative embodiment herein, the method includes forming a silicon/germanium layer on a surface of a semiconductor substrate, forming at least one insulating material layer on the silicon/germanium layer, thereafter performing an annealing process, removing the at least one insulating material layer for exposing a surface of the silicon/germanium layer, and forming a gate dielectric material layer on the exposed surface of the silicon/germanium layer.

In a second aspect of the present disclosure, a method of forming a semiconductor device structure is provided. In one illustrative embodiment herein, the method includes providing a semiconductor substrate with a first semiconductor device region and a second semiconductor device region, forming a silicon/germanium layer on the semiconductor substrate in the first semiconductor device region, forming at least one insulating material layer over the semiconductor substrate in the first and second semiconductor device regions, thereafter performing an annealing process, removing the at least one insulating material layer in the first semiconductor device region for exposing a surface of the silicon/germanium layer, and forming a gate dielectric material layer on the exposed surface of the silicon/germanium layer.

In a third aspect of the present disclosure, a semiconductor device is provided. In one illustrative embodiment herein, the semiconductor device includes a silicon/germanium channel formed on a surface of a semiconductor substrate and a gate dielectric layer formed on the silicon/germanium channel. Furthermore, the semiconductor device has a DIT of substantially smaller than 5.3E11.

In a fourth aspect of the present disclosure, a semiconductor device structure is provided. In one illustrative embodiment herein, the semiconductor device structure includes a first semiconductor device formed in a first semiconductor device region of a semiconductor substrate and a second semiconductor device formed in a second semiconductor device region of the semiconductor substrate. Herein, the first semiconductor device includes a silicon/germanium channel formed on a surface of a semiconductor substrate and a gate dielectric layer formed on the silicon/germanium channel.

Furthermore, the second semiconductor device includes at least one insulating material layer formed on the surface of the semiconductor substrate. Herein, the first semiconductor device has a DIT of less than 5.3E11.

BRIEF DESCRIPTION OF THE DRAWINGS

The disclosure may be understood by reference to the following description taken in conjunction with the accompanying drawings, in which like reference numerals identify like elements, and in which.

Figure 1:
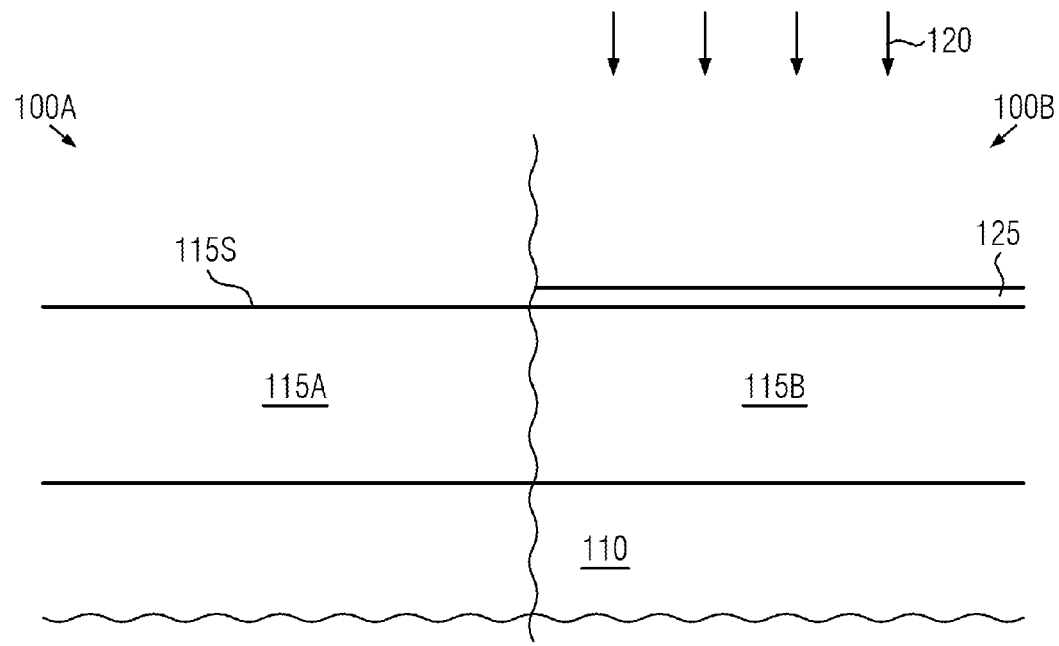
FIGS. 1-6 schematically illustrate in cross-sectional views illustrative process flows of fabricating semiconductor devices in accordance with illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present invention relates to semiconductor device structures and particularly to semiconductor devices such as metal oxide semiconductor devices or MOS devices. The person skilled in the art will appreciate that, although the expression "MOS device" is used, no limitation to a metal-containing gate material and/or to an oxide-containing gate dielectric material is intended. Semiconductor devices of the present disclosure and particularly MOS devices as illustrated by means of some illustrative embodiments as described herein concern devices fabricated by using advanced technologies. Semiconductor devices and particularly MOS devices of the present disclosure are fabricated by technologies applied to approach technology nodes smaller than 100 nm, preferably smaller than 50 nm, more preferably smaller than 35 nm. The person skilled in the art will appreciate that the present disclosure suggests semiconductor devices, and particularly MOS devices, having gate structures such as gate stacks having a gate electrode material layer and a gate dielectric material layer with a length dimension smaller than 100 nm, preferably smaller than 50 nm, more preferably smaller than 35 nm. The present invention suggests providing methods of achieving reliable encapsulation of gate structures at very early stages of fabrication.

The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. A circuit designer can mix and match device types, using PMOS and NMOS transistors, stressed and unstressed, to take advantage of the best characteristics of each device type as they best suit the circuit being designed. The person skilled in the art understands that stress and strain may be generally described with regard to the tensile modulus.

In describing the following figures, semiconductor device structures and methods of forming a semiconductor device in accordance with various exemplary embodiments of the present disclosure will be illustrated. The described process steps, procedures and materials are to be considered only as exemplary embodiments designed to illustrate to one of ordinary skill in the art methods for practicing the invention. However, it is to be understood that the invention is not exclusively limited to the illustrated and described exemplary embodiments as many possible modifications and changes exist which will become clear to the ordinary skilled in the art when studying the present detailed description together with the accompanied drawings and the above background and summary of the invention. Illustrated portions of semiconductor devices and semiconductor device structures may include only a single MOS structure, although those skilled in the art will recognize that actual implementations of integrated circuits may include a large number of such structures. Various steps in the manufacture of semiconductor devices and semiconductor device structures are well known and so, in the interest of brevity, many conventional steps will only be mentioned briefly herein, or will be omitted entirely without providing the well-known process details.

With regard to FIGS. 1-6, various illustrative embodiments of the present invention will be described in greater detail.

FIG. 1 shows a semiconductor device structure at an early stage during fabrication, wherein the semiconductor device structure comprises semiconductor device regions 100A and 100B. The semiconductor device region 100A comprises a semiconductor material layer 115A, while the semiconductor device region 100B comprises a semiconductor material layer 115B. The semiconductor device regions 100A and 100B, and accordingly the semiconductor material layers 115A and 115B, may be directly adjacent to each other or may be separated by one or more further semiconductor device regions (not illustrated) which may be formed in between the semiconductor device regions 100A and 100B. It is further possible that the semiconductor device regions 100A and 100B are delineated and/or separated by one or more further insulating regions (not illustrated), such as shallow trench isolations (STI) or the like.

The semiconductor material layers 115A and 115B may be composed of the same material or may have different material compositions. For example, the semiconductor material layers 115A, 115B may be composed of silicon, silicon/germanium, silicon carbide, and combinations thereof. The person skilled in the art will appreciate that the semiconductor material layers 115A, 115B may have dopants incorporated therein for forming at least one of a P-well and an N-well. The semiconductor material layers 115A, 115B may be formed on a further material 110, which may be given by a semiconductor substrate, such as a silicon substrate as conventionally used in bulk configurations, or may represent an insulating material such as conventionally used on silicon-on-insulator (SOI) configurations. The person skilled in the art will appreciate that the material 110 may in special illustrative examples be explicitly given by a buried oxide (BOX) layer.

By exposing the semiconductor device region 100B to a deposition process 120, a silicon/germanium layer 125 is formed on a surface 115S of the semiconductor material layer in the semiconductor device region 100B, particularly on the surface 115S of the semiconductor material layer 115B. As illustrated in FIG. 1, the semiconductor device region 100A is not exposed to the deposition process 120 and particularly no material is deposited on the surface 115S of the semiconductor material layer 115A in the semiconductor device region 100A. The person skilled in the art will appreciate that a masking pattern (not illustrated) may be formed over the semiconductor material layer 115A such that the semiconductor device region 100B is exposed to the deposition process 120, while the semiconductor device region 100A is prevented from being exposed to the deposition process 120.

In a special illustrative embodiment herein, the deposition process 120 may be a molecular beam epitaxy (MBE) process in which a germanium content of about 20-45% may be incorporated into silicon such that a silicon/germanium layer having a germanium content of about 20-45% may be epitaxially grown.

Figure 2:
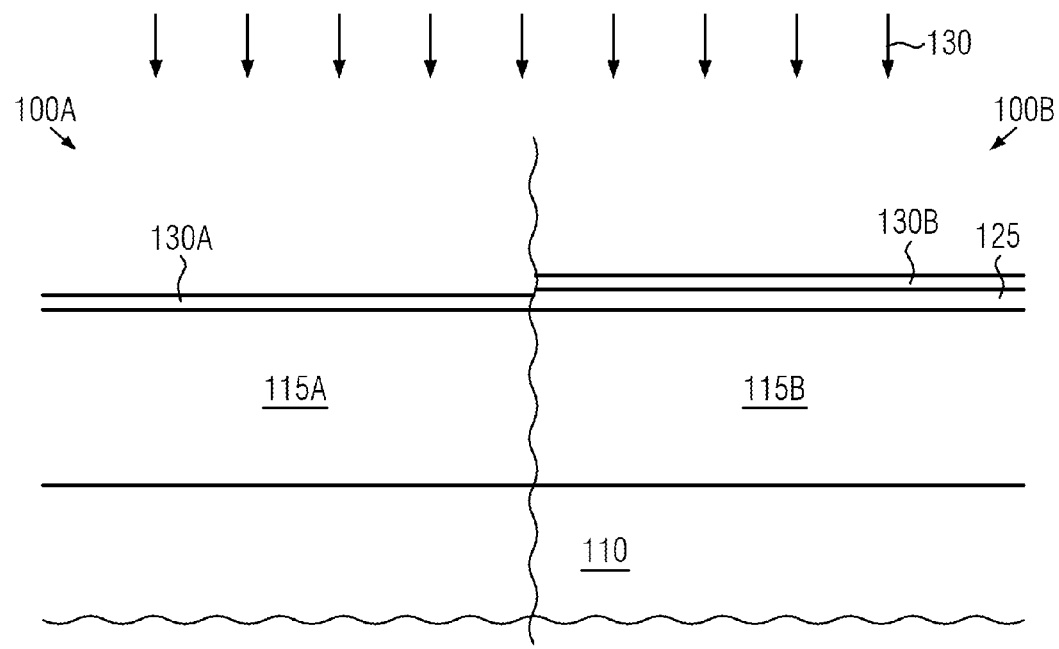

FIG. 2 illustrates the semiconductor device regions 100A, 100B at a more advanced stage during fabrication, particularly when a further deposition process 130 is applied to the semiconductor device regions 100A, 100B. The further deposition process 130 is performed to deposit an insulating material, such as a silicon oxide material, on the surface 115S (see FIG. 1) of the semiconductor material layer 115A in the semiconductor device region 100A. During the deposition process 130, an insulating material layer 130A is formed on the surface 115S of the semiconductor material layer 115A in the semiconductor device region 100A and an insulating material layer 130B is formed on the silicon/germanium layer 125 in the semiconductor device region 100B. The insulating material layer 130B is formed over the semiconductor material layer 115B and disposed on the silicon/germanium layer 125. The person skilled in the art will appreciate that the insulating material layer 130B may protect the silicon/germanium layer 125 in the semiconductor device region 100B from deteriorating effects of subsequently performed process sequences. For example, as silicon/germanium materials have different etching rates when compared to silicon, for instance, undue loss of silicon/germanium material may appear in cleaning and etching process sequences to which silicon/germanium materials may be exposed.

In some illustrative embodiments herein, the insulating material layers 130A, 130B may be formed with a thickness of 10 nm or less, or 5 nm or less. The insulating material layers 130A, 130B may comprise a silicon oxide material, a silicon nitride material or the like. However, this does not pose any limitation to the present disclosure and the person skilled in the art will appreciate that, in some alternative embodiments, the insulating material layers 130A, 130B may be omitted.

Figure 3:
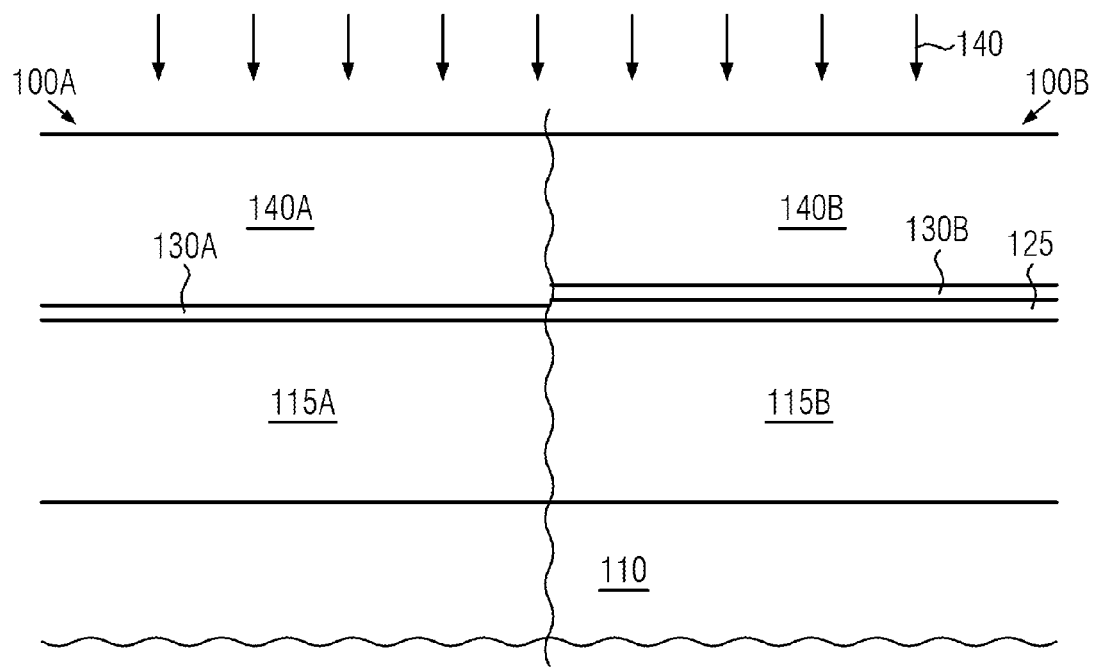

FIG. 3 illustrates the semiconductor device regions 100A, 100B at a more advanced stage during fabrication, particularly when another deposition process 140 is performed to deposit a second insulating material over the semiconductor material layers 115A, 115B. In applying the deposition process 140 to the semiconductor device region 100A, a second insulating material layer 140A is formed over the semiconductor material layer 115A and particularly on the insulating material layer 130A. In applying the deposition process 140 to the semiconductor device region 100B, a second insulating material layer 140B is formed over the semiconductor material layer 115B and particularly on the insulating material layer 130B.

According to a special illustrative example herein, the deposition process 140 may comprise an LPCVD process performed at temperatures greater than 800° C. For example, a combination of dichlorosilane $SiH_2Cl_2$ and $N_2O$ may be used at temperatures of 900° C. or more in order to form a high thermal oxide (HTO) layer of $SiO_2$ material on the insulating material layers 130B, 130A.

Figure 4:
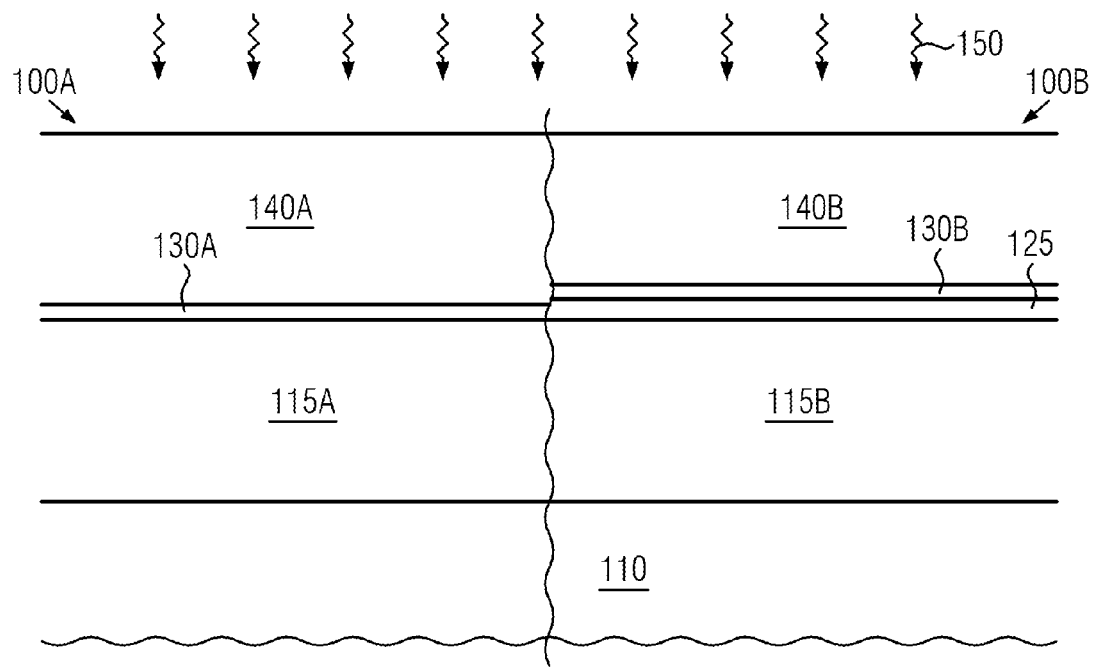

FIG. 4 shows the semiconductor device structure at a more advanced stage during fabrication when an annealing process 150 is applied to the semiconductor device structure. In one illustrative embedment, the annealing process 150 may comprise an annealing sequence at an annealing temperature higher than 800° C. In a special illustrative example herein, the annealing temperature may be in a range from about 850-1000° C., such as, for example, about 900° C. The illustrative annealing sequence may be performed in an inert atmosphere, for example a nitrogen atmosphere implementing an N2 annealing process. In an alternative embodiment, an argon atmosphere may be used instead of the nitrogen atmosphere.

Figure 5:
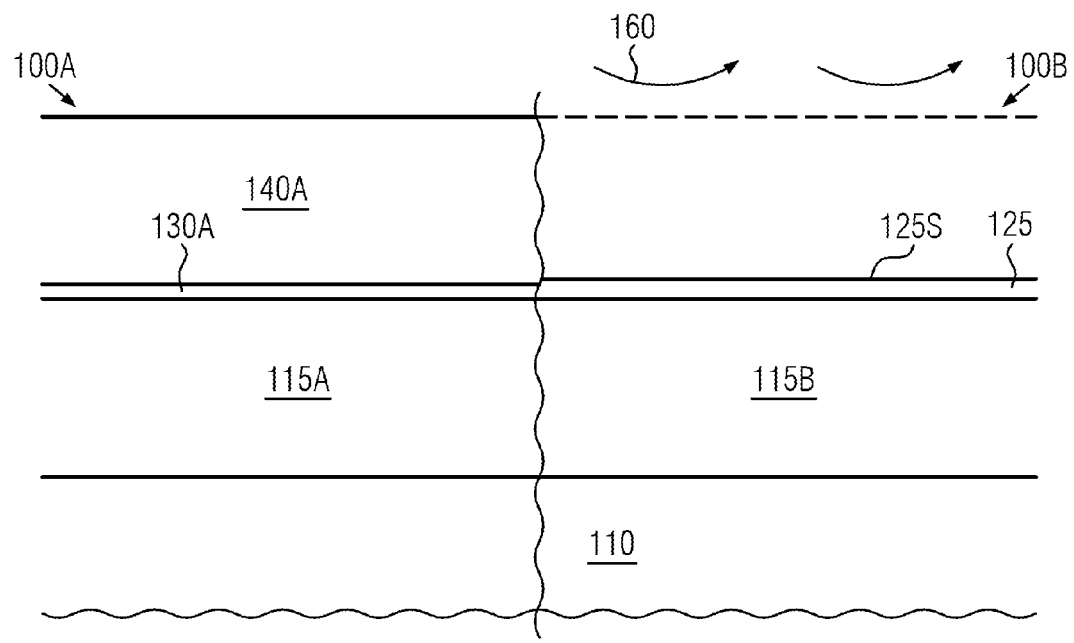

FIG. 5 shows the semiconductor device structure at a more advanced stage during fabrication, at which a removal process 160 is applied to the semiconductor device region 100B so as to remove the insulating material layers 140B and 130B from above the silicon/germanium layer 125.

In some explicitly disclosed illustrative examples, the following etch chemistry may be used: 50A POU-DHF; SPM; 120S cold APM with about 100% MEGASONIC rinse; HPM. However, this does not pose any limitation to the present disclosure.

In a special illustrative embodiment, the silicon layer may be formed on the silicon/germanium layer such that the silicon/germanium layer is protected from undue loss of silicon/germanium material and surface roughness.

The person skilled in the art will appreciate that the semiconductor device region 100A is not exposed to the removal process 160. This may be achieved by forming an appropriate masking pattern over the semiconductor device region 100A for protecting the second insulating material 140A in the semiconductor device region 100A. In exposing a surface 125S of the silicon/germanium material layer 125, the removal process 160 is completed. The person skilled in the art will appreciate that, in exposing the surface 125S to the removal process 160 at the end of the process 160, the surface 125S is still attacked by the removal process 160, resulting in an increased surface roughness for the silicon/germanium material layer 125. However, as will be explained in greater detail with regard to the FIGS. 7 and 8 below, the present disclosure may result in a surface roughness of the surface 125S that is improved in comparison with the state of the art.

Figure 6:
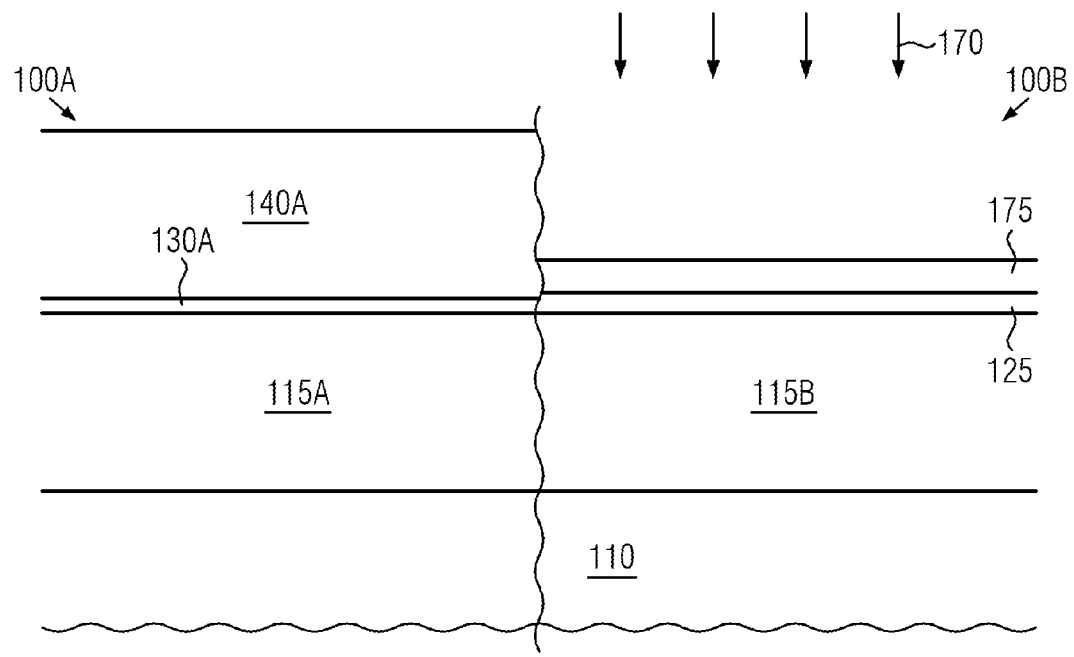

FIG. 6 shows the semiconductor device structure at a more advanced stage during fabrication, at which a further deposition process 170 is applied to the semiconductor region 100B so as to form a gate dielectric material layer 175 on the silicon/germanium material layer 125 in the semiconductor device region 100B. The person skilled in the art will appreciate that the deposition process 170 may be implemented such that the gate dielectric material layer 175 is formed for providing a desired semiconductor device in the semiconductor device region 100B. For example, the gate dielectric material layer may comprise one or more sub-layers (not illustrated) comprising at least at least one of high-k dielectric materials and work function adjusting materials.

The person skilled in the art will appreciate that the semiconductor device region 100A is not exposed to the deposition process 170, for instance, by having a masking pattern (not illustrated) formed over the second insulating material layer 140A.

Subsequently, processing may continue by forming gate electrode material layers over the semiconductor device regions 100A and 100B and applying patterning sequences (not illustrated) to form gate electrode structures (not illustrated) in the semiconductor device regions 100A and 100B. Therefore, one or more gate electrode structures (not illustrated) may be formed within the semiconductor device region 100A, the one or more gate electrode structures (not illustrated) having thick gate dielectric layers (130A, 140A in FIG. 6), while one or more gate electrode structures (not illustrated) formed in the semiconductor device region 100B have comparably thin gate dielectric layers (125, 175 in FIG. 6). Therefore, gate electrode structures (not illustrated) formed in semiconductor device regions 100A may be advantageously used as I/O semiconductor devices to which high voltages, such as 5V or more, or 10V or more, may be applied during operation. The person skilled in the art will appreciate that, in accordance with some illustrative embodiments, semiconductor devices provided in the semiconductor device region 100A may be I/O devices having much thicker gate oxides such that higher voltages may be applied, e.g., EG devices, while semiconductor devices provided in the semiconductor device region 100B may be normal core devices, e.g., SG devices.

Figure 7:
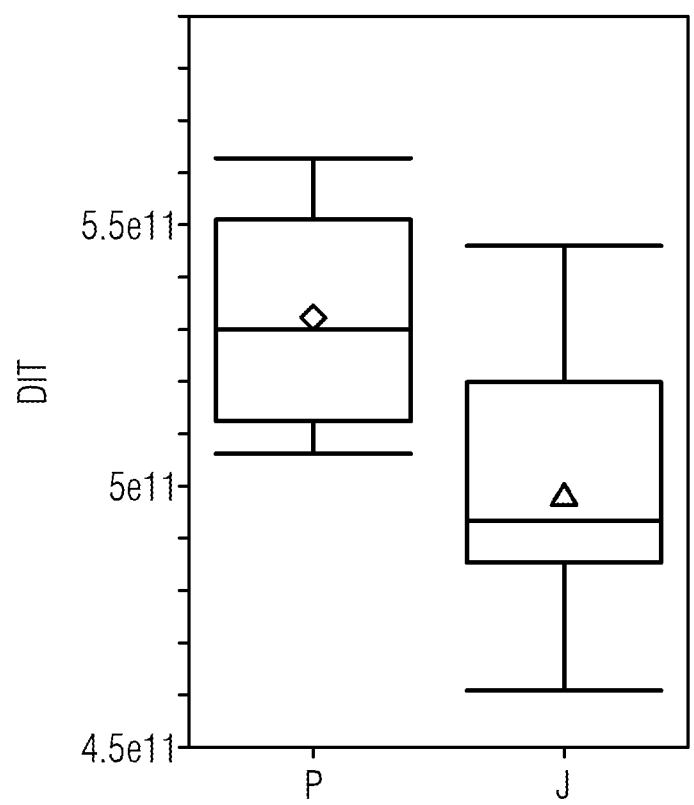
FIG. 7 schematically illustrates an interface trap density of conventional semiconductor device structures in comparison with semiconductor device structures of illustrative embodiments of the present disclosure.

FIG. 7 schematically illustrates interface trap densities (DIT) measured by charge pumping for semiconductor devices of the present disclosure and conventional semiconductor devices. Generally, charge pumping is a well-known technique for characterizing semiconductor/dielectric interfaces of semiconductor device structures. Invaluable information about the quality and degradation of a device may be obtained from charge-pumping-current measurements, including information about the interface-trap density and the mean-capture cross section. For example, charge-pumping-current measurements may be performed by pulsing a gate voltage and measuring a DC substrate current simultaneously. Herein, a gate of a transistor to be measured is connected with a pulse generator, which is configured to repeatedly switch the transistor from accumulation to inversion. While the gate is pulsed, a recombination process of majority and minority carriers occurs on the rising and falling edges of the pulses, causing a current to flow in the opposite direction of the normal drain-to-source current. This induced current may be measured by connecting a sensitive ammeter to the substrate, or bulk terminal, of the transistor. The substrate current is usually measured while voltage pulses of known amplitude, rise time and frequency are applied to the transistor gate. Source and drain may be either connected to a ground potential or may be slightly reverse-biased. According techniques are well known in the art and the skilled person may employ various charge-pumping techniques, such as using different amplitudes (fixed, variable voltage amplitude being pulsed into inversion, etc.), voltage waveform shapes, varying rise and fall times, measuring the charge-pumping current as a function of frequency.

The person skilled in the art will appreciate that DIT may be understood as reflecting an interface roughness between a silicon material surface (e.g., surface 125S in FIG. 1) to an overlying gate dielectric material layer (e.g., 175 in FIG. 6). Particularly, FIG. 7 illustrates box-plots obtained in measurements applied to conventional semiconductor devices presented by the box-plot at the left (denoted by "P") in comparison with measurements applied to semiconductor devices in accordance with the present disclosure as presented by the box-plot on the right hand (denoted by "J"). An average DIT as indicated by diamonds in the box-plot on the left hand and the triangle in the box-plot on the right hand is reduced by about 6% for semiconductor devices (box-plot J) that were exposed to an annealing process (annealing process 150 in FIG. 4) as compared to conventional semiconductor devices (box-plot P). The person skilled in the art will appreciate that a reduction of DIT reflects an improvement in the interface roughness as the interface charge trapping and detrapping represented by DIT are subjected to less fluctuations.

Figure 8A:
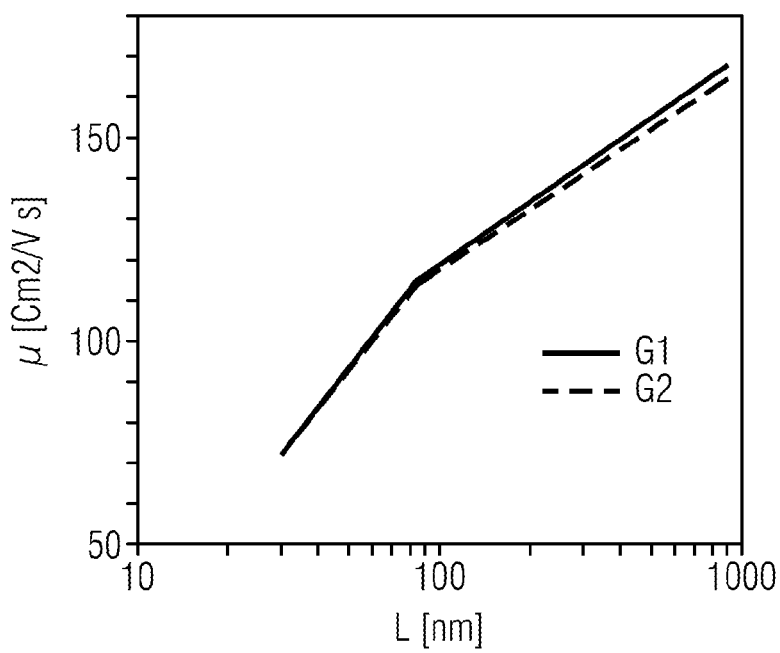
FIGS. 8a-8b schematically illustrate graphical relations between the mobility of charge carriers and gate lengths of conventional NMOS and PMOS devices in comparison with NMOS and PMOS devices of illustrative embodiments of the present disclosure.

FIG. 8a shows a graphic relation between mobility of charge carriers ($\mu$ measured in $Cm^2/Vs$, ordinate) and gate length (L measured in nanometer abscissa) for NMOS devices of the present disclosure having a width of 1 µm, wherein the gate length value plotted on the abscissa presents median values. Solid lines denoted by reference number G1 relate to NMOS devices exposed to a high thermal anneal (annealing process 150 in FIG. 4). Broken lines denoted by reference numeral G2 relate to conventional semiconductor devices used as comparison samples.

FIG. 8a shows that the mobility of NMOS devices is improved to a small extent as the broken line G2 is only slightly underneath the solid line G1.

Figure 8B:
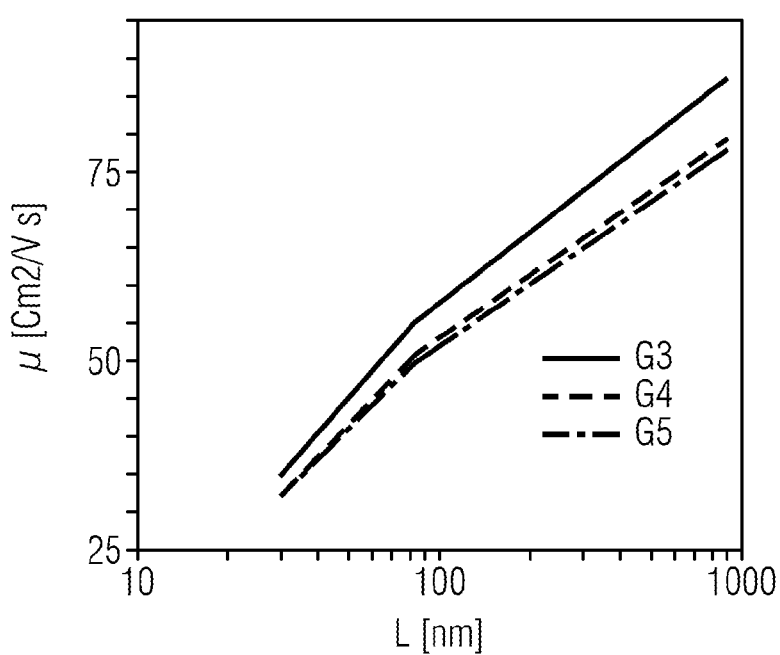

FIG. 8b shows another graphic relation between mobility of charge carriers ($\mu$ measured in $Cm^2/Vs$, ordinate) and gate length (L measured in nanometer abscissa) in the case of PMOS devices of the present disclosure having a width of 1 µm, wherein the gate length value plotted on the abscissa presents median values. Solid lines denoted by reference number G3 relate to NMOS devices exposed to a high thermal anneal (annealing process 150 in FIG. 4). Broken lines denoted by reference numerals G4 and G5 relate to conventional semiconductor devices used as comparison samples.

As FIGS. 8a and 8b suggest, PMOS devices subjected to the additional high annealing process (annealing process 150 in FIG. 4) show a considerably improved mobility which is even maintained down to small length scales. Particularly, the mobility $\mu$ of PMOS semiconductor devices according to the present disclosure is improved by at least 55% as opposed to conventional semiconductor devices used as comparison samples for a given gate length.

The person skilled in the art will appreciate that the present disclosure provides methods of fabricating semiconductor devices having higher mobility and, therefore, improving device performance. Furthermore, semiconductor device structures of the present disclosure show a reduced variation due to interface charge trapping and deep trapping effects at interfaces between semiconductor material layer and gate dielectric material layer. Consequently, the reliability of semiconductor devices is improved by the methods and devices presented in the present disclosure.

Some illustrative embodiments are described with regard to a first insulating material layer and a second insulating material layer. This does not pose any limitation to the present disclosure. The person skilled in the art will appreciate that, in alternative illustrative embodiments, one of the first insulating material layer and the second insulating material layer may be omitted and instead only one insulating material layer may be provided. Therefore, one of the deposition process 120 in FIG. 1 and the process 130 in FIG. 2 may be optional and, consequently, may be omitted in alternative embodiments. Furthermore, the person skilled in the art will appreciate that more than two insulating material layers may be formed prior to the anneal.

The person skilled in the art will appreciate that the annealing process 150 performed in FIG. 4 helps to reduce silicon/germanium loss to which conventional semiconductor devices are subjected when removing the insulating material layer from above the silicon/germanium channel. Therefore, the present disclosure allows improvement of electrical properties of gate dielectric material layers, which are critical to the formation of a conductive channel region below a gate electrode.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, comprising:
    forming a silicon germanium layer on a surface of a semiconductor substrate, the silicon germanium layer having an upper surface;
    forming at least one insulating material layer on an entire upper surface of said silicon germanium layer;
    thereafter performing an annealing process;
    removing said at least one insulating material layer for exposing the entire upper surface of said silicon germanium layer; and
    forming a gate dielectric material layer on said exposed the entire upper surface of said silicon germanium layer.

2. The method of claim 1, wherein a first and a second insulating material layer are formed on said semiconductor substrate and wherein forming said first insulating material layer comprises depositing a silicon oxide material on said silicon germanium layer.

3. The method of claim 2, wherein forming said second insulating material layer comprises depositing an HTO oxide layer.

4. The method of clam 3, wherein depositing said second insulating material layer comprises an LPCVD deposition process at temperatures higher than 800° C.

5. The method of claim 1, wherein said annealing process is performed in a nitrogen atmosphere at an annealing temperature higher than 800° C.

6. The method of claim 5, wherein said annealing temperature is about 900° C.

7. A method of forming a semiconductor device structure, comprising:
   providing a semiconductor substrate with a first semiconductor device region and a second semiconductor device region, the silicon germanium layer having an upper surface;
   forming a silicon germanium layer on said semiconductor substrate in said first semiconductor device region, the silicon germanium layer having an upper surface;
   forming at least one insulating material layer over said semiconductor substrate so as to cover an entirety of each of said first semiconductor device region and said second semiconductor device region;
   thereafter performing an annealing process;
   removing said at least one insulating material layer in said first semiconductor device region so an to thereby expose an entire upper surface of said silicon germanium layer; and
   forming a gate dielectric material layer on said exposed the entire upper surface of said silicon germanium layer.

8. The method of claim 7, wherein a first and a second insulating material layer are formed on said semiconductor substrate and wherein forming said first insulating material layer comprises depositing a silicon oxide material on said entire upper surface of said silicon germanium layer.

9. The method of claim 8, wherein forming said second insulating material layer comprises depositing an HTO oxide layer.

10. The method of clam 9, wherein depositing said second insulating material layer comprises an LPCVD deposition process at temperatures higher than 800° C.

11. The method of claim 7, wherein said annealing process is performed in a nitrogen atmosphere at an annealing temperature higher than 800° C.

12. The method of claim 11, wherein said annealing temperature is about 900° C.

13. The method of claim 7, further comprising forming a gate electrode in said second semiconductor region, said gate electrode having a threshold voltage higher than 5V.

14. The method of claim 7, wherein said first semiconductor device region is N doped and said second semiconductor device region is P-doped.

* * * * *

UNITED STATES PATENT AND TRADEMARK OFFICE
CERTIFICATE OF CORRECTION

PATENT NO. : 9,136,266 B2  
APPLICATION NO. : 13/943229  
DATED : September 15, 2015  
INVENTOR(S) : Ran Yan et al.

Page 1 of 1

It is certified that error appears in the above-identified patent and that said Letters Patent is hereby corrected as shown below:

Col. 10, line 55 (claim 1, line 12), after "exposed" delete "the".

Col. 11, lines 10-11 (claim 7, lines 5-6), after "region" delete ", the silicon germanium layer having an upper surface".

Col. 11, line 21 (claim 7, line 16), change "so an to" to -- so as to --.

Col. 11, line 24 (claim 7, line 19), after "exposed" delete "the".

Signed and Sealed this  
Twelfth Day of July, 2016

Michelle K. Lee  
*Director of the United States Patent and Trademark Office*